(12) United States Patent
Beppu

(10) Patent No.: US 6,812,728 B2
(45) Date of Patent: Nov. 2, 2004

(54) TEST METHOD OF INTERNAL CONNECTIONS IN A SEMICONDUCTOR PACKAGE

(75) Inventor: Takemi Beppu, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/650,387

(22) Filed: Aug. 28, 2003

(65) Prior Publication Data

US 2004/0051552 A1 Mar. 18, 2004

(30) Foreign Application Priority Data

Sep. 17, 2002 (JP) ........................................ 2002-269893

(51) Int. Cl.[7] .......................... G01R 31/26; G01R 1/04; H01H 31/02
(52) U.S. Cl. ...................... 324/765; 324/537; 324/158.1
(58) Field of Search ................................ 324/765, 537, 324/158.1, 768, 763; 438/14–18; 345/718; 714/726–727, 729, 733–734

(56) References Cited

U.S. PATENT DOCUMENTS

| | | | |
|---|---|---|---|
| 4,963,824 A * | 10/1990 | Hsieh et al. | 324/763 |
| 5,446,395 A * | 8/1995 | Goto | 324/763 |
| 5,610,530 A * | 3/1997 | Whetsel | 324/763 |
| 5,659,257 A * | 8/1997 | Lu et al. | 324/763 |
| 6,297,643 B2 * | 10/2001 | De Jong et al. | 324/537 |

* cited by examiner

Primary Examiner—David A. Zarneke
Assistant Examiner—Jermele Hollington
(74) Attorney, Agent, or Firm—Fish & Richardson P.C.

(57) ABSTRACT

There has been no appropriate means to test connections between two integrated circuits packaged in a single semiconductor package. This invention offers a test method on internal connections in a semiconductor package housing a first integrated circuit and a second integrated circuit connected with each other, including applying a test signal to a first pin of the semiconductor package, applying the test signal from the first pin to the first integrated circuit, applying a first signal generated in the first integrated circuit from the test signal to the second integrated circuit, applying a second signal generated in the second integrated circuit from the first signal back to the first integrated circuit, leading a third signal generated in the first integrated circuit from the second signal out of the semiconductor package through a second pin of the semiconductor package and confirming connections between the first integrated circuit and the second integrated circuit by verifying the third signal led out of the semiconductor package.

6 Claims, 1 Drawing Sheet

TEST METHOD OF INTERNAL CONNECTIONS IN A SEMICONDUCTOR PACKAGE

BACKGROUND OF THE INVENTION

1. Field of the Invention

This invention relates to a test method of internal connections in a semiconductor package used for a TV receiver and the like, specifically to a test method of internal connections in a semiconductor package which houses a CPU (Microcomputer) and a TV signal processing IC.

2. Description of the Related Art

Basic demodulation of TV signals to display video images on a screen is implemented with two integrated circuits i.e. a CPU and a TV signal processing IC in a TV receiver in recent years. The TV signal processing IC processes a brightness signal, a color signal and a deflection signal in the TV signals. The CPU gives the TV signal processing IC various instructions such as channel selection and image quality adjustment.

All integrated circuits are tested for connection, correct operation and so on before a semiconductor manufacturer ships them. The CPU and the TV signal processing IC are also tested with an IC tester. The two integrated circuits are purchased and mounted on a printed circuit board by a consumer electronics maker who manufactures TV receivers. After assembly, a test is made. That is, it is examined whether each of the two integrated circuits is connected properly, for example.

Recently, housing the CPU and the TV signal processing IC in a single semiconductor package has been considered. It means two chips in a single package, that is, a single semiconductor package housing two integrated circuits. The consumer electronics maker benefits from the single semiconductor package housing two integrated circuits because he only needs to purchase and mount the single semiconductor package which requires reduced wirings on the printed circuit board. However, the semiconductor manufacturer has no appropriate means to test connections between the two integrated circuits once they are packaged in the single semiconductor package.

SUMMARY OF THE INVENTION

This invention is directed to solve the problem addressed above, and offers a test method on internal connections in a semiconductor package housing a first integrated circuit and a second integrated circuit connected with each other, including applying a test signal to a first pin of the semiconductor package, applying the test signal from the first pin to the first integrated circuit, applying a first signal generated in the first integrated circuit from the test signal to the second integrated circuit, applying a second signal generated in the second integrated circuit from the first signal to the first integrated circuit, leading a third signal generated in the first integrated circuit from the second signal out of the semiconductor package through a second pin of the semiconductor package and confirming connections between the first integrated circuit and the second integrated circuit by verifying the third signal led out of the semiconductor package.

DETAILED DESCRIPTION OF THE INVENTION

Figure 1:
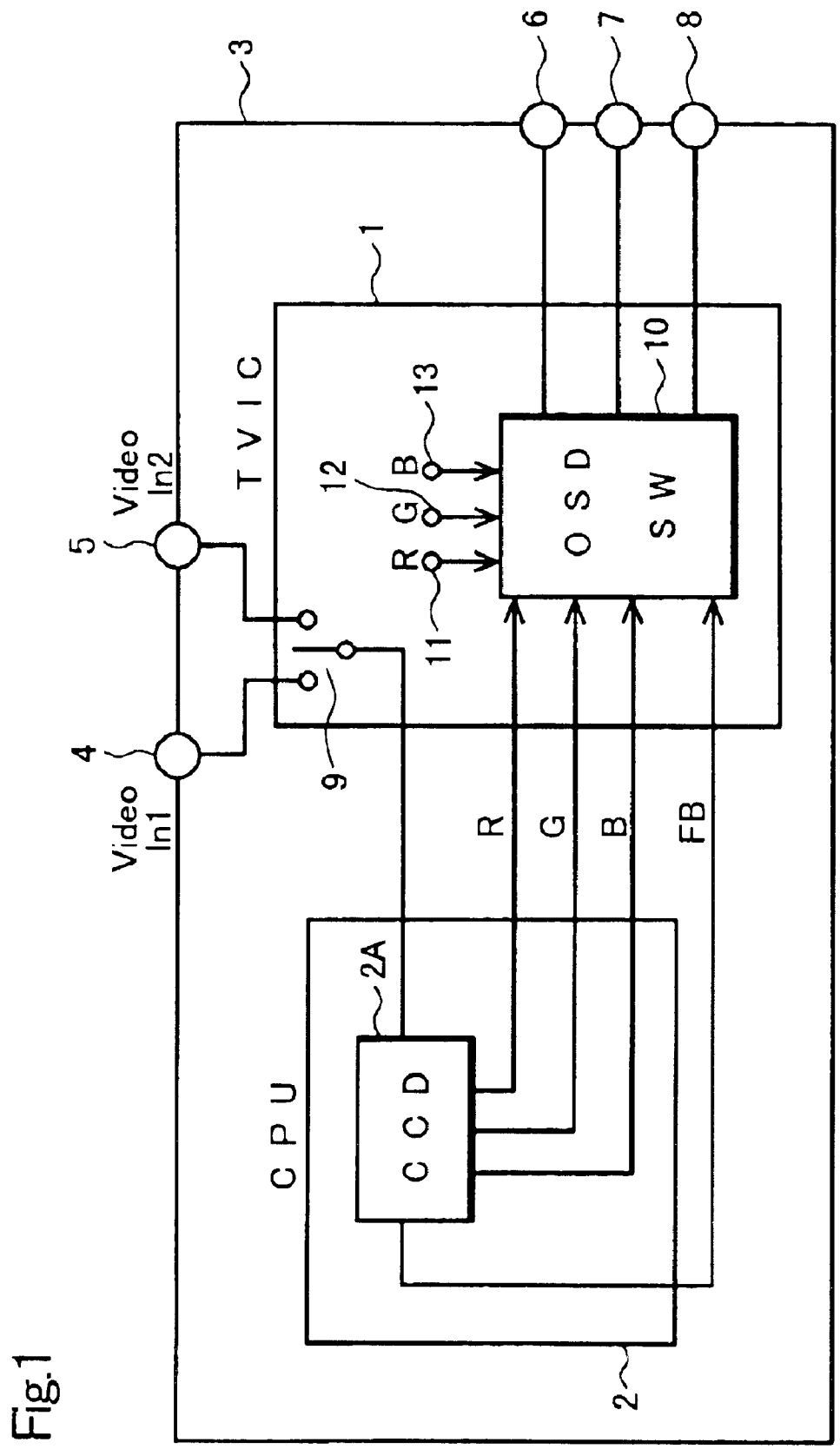
FIG. 1 shows the test method of the internal connections in the semiconductor package according to an embodiment of this invention.

Next, an embodiment of this invention will be described referring to FIG. 1. A TV signal processing IC 1 shown in FIG. 1 implements signal processing such as demodulation of a brightness signal, a color signal and a deflection signal in TV signals to generate three primary color signals R, G and B. A CPU 2 includes a CCD (Closed Caption Signal Decoder) 2A and gives the TV signal processing IC 1 various instructions such as channel selection and image quality adjustment.

A semiconductor package 3 houses the TV signal processing IC 1 and the CPU 2. A video signal over the air is applied through a first video input pin 4. A video signal from a VCR or the like is applied through a second video input pin 5. Each of the primary color signals R, G and B is outputted through each of pins 6, 7 and 8, respectively, of the semiconductor package 3.

Each of the two integrated circuits is implemented in an independent chip, and connected with each other in the semiconductor package 3. Although two semiconductor chips are included, these two semiconductor chips look a single semiconductor device in appearance.

Next, operation of a circuit shown in FIG. 1 will be described. The connections between the TV signal processing IC 1 and the CPU 2 are examined through the pins 4, 5, 6, 7 and 8 of the semiconductor package 3 in this embodiment. In order to do that, it is decided to use a signal which requires traveling back and forth between the TV signal processing IC 1 and the CPU 2. When the signal which requires traveling back and forth between the TV signal processing IC 1 and the CPU 2 is applied from outside the semiconductor package 3 and a resulting signal appears to be correct, then it means the TV signal processing IC 1 and the CPU 2 must be connected correctly. The resulting signal needs to be led out of the semiconductor package 3. A video signal including a closed caption signal seems to be a signal which satisfies requirements described above.

With the closed caption broadcasted in the United States, speech and narration are superimposed as subtitles so that the hearing-impaired can enjoy TV and VCR. Text information of the speech and the narration is encoded and superimposed on a part of the video signal. The encoded text information is decoded in the CPU 2, reconstituted as the video signal and eventually displayed on a screen as the subtitle. That is to say, the encoded text information makes a part of the video signal at first, is applied to the CPU 2, reconstitutes into the video signal, and is finally led out of the semiconductor package to be displayed on the screen. Thus it is decided to utilize the encoded text information to examine the connections between the TV signal processing IC 1 and the CPU 2.

The video signal over the air is applied to the first video input pin 4, while the video signal from the VCR or the like is applied to the second video input pin 6. The encoded data for the closed caption is attached to each of the video signals. Both of the video signals are applied to the TV signal processing IC 1, in which one of them is selected by an internal switch 9. The video signal once entered into the TV signal processing IC 1 and selected by the internal switch 9 is applied from the TV signal IC 1 to the CPU 2. The CPU 2 is equipped with the CCD 2A which decodes the encoded data for the closed caption broadcast. Then the CPU 2 generates three primary color signals R, G and B showing picture information for the subtitle and FB (Fast Blanking Pulse) indicating their display timing. The picture information is applied back to the TV signal processing IC 1 to reconstitute the video signal and display the picture on the screen.

The TV signal processing IC 1 has an OSD (On Screen Display) switch 10. The OSD switch 10 is to select three primary color signals R, G and B to be outputted from the semiconductor package 3. A video signal for a normal picture to be displayed on the screen is demodulated in the TV signal processing IC 1 and resulting three primary color signals R, G and B are applied to terminals 11, 12 and 13. On the other hand, the three primary color signals showing the picture information for the subtitle are provided from the CPU 2 together with the FB (Fast Blanking Pulse) which indicates their display timing. The OSD switch 10 selects the three primary color signals from the CPU 2 while the FB is applied, and selects the three primary color signals from the terminals 11, 12 and 13 otherwise.

Each of the three primary color signals R, G and B with the superimposed subtitle appears at each of the pins 6, 7 and 8, respectively. Therefore, the connections between the TV signal processing IC 1 and the CPU 2 can be examined by confirming that the subtitle is correctly superimposed on the normal picture.

According to this invention, connections between the first and the second integrated circuits packaged in the single semiconductor package can be examined easily by applying the test signal which needs to be provided to both of the first and the second integrated circuits.

Specifically with the single package 3 housing the TV signal processing IC 1 and the CPU 2, the connections between the TV signal processing IC 1 and the CPU 2 can be easily examined by verifying correlation between the signal to the input pin of the semiconductor package 3 and the signal from the output pin of the semiconductor package 3, utilizing the closed caption signal, according to this invention.

What is claimed is:

1. A test method of internal connections between a first integrated circuit and a second integrated circuit, both of which are housed in a semiconductor package and connected with each other, comprising:

applying a test signal to a first pin of the semiconductor package;

applying the test signal from the first pin to the first integrated circuit;

applying a first signal generated in the first integrated circuit from the test signal to the second integrated circuit;

applying a second signal generated in the second integrated circuit from the first signal to the first integrated circuit;

outputting a third signal generated in the first integrated circuit from the second signal to a second pin of the semiconductor package; and verifying the third signal outputted to the second pin of the semiconductor package.

2. The test method of claim 1, wherein the first integrated circuit comprises a TV signal processing IC which demodulates a TV signal.

3. The test method of claim 2, wherein the second integrated circuit comprises a microcomputer which has a function to decode a signal from the TV signal processing IC.

4. The test method of claim 3, wherein the test signal comprises a closed caption signal.

5. The test method of claim 4, wherein the signal outputted to the second pin comprises one of three primary color signals selected by a switch provided in the first integrated circuit between three primary color signals to display a normal picture and three primary color signals to display a subtitle.

6. The test method of claim 3, wherein the test signal comprises a video signal comprising a closed caption signal.

* * * * *